United States Patent [19]

Trimble

[11] Patent Number: 4,754,465
[45] Date of Patent: Jun. 28, 1988

[54] GLOBAL POSITIONING SYSTEM COURSE ACQUISITION CODE RECEIVER

[75] Inventor: Charles R. Trimble, Los Altos Hills, Calif.

[73] Assignee: Trimble Navigation, Inc., Sunnyvale, Calif.

[21] Appl. No.: 607,824

[22] Filed: May 7, 1984

[51] Int. Cl.⁴ ............................................. H04K 1/00
[52] U.S. Cl. ........................................ 375/1; 375/120; 370/104; 370/107
[58] Field of Search .................. 375/1, 115, 119, 120; 455/173, 257, 330; 370/104, 107

[56] References Cited

U.S. PATENT DOCUMENTS

| | | | |
|---|---|---|---|
| 3,681,697 | 8/1972 | Moroney | 455/302 |
| 4,203,070 | 5/1980 | Bowles et al. | 375/115 |
| 4,232,395 | 11/1980 | Yokogawa | 455/173 |
| 4,247,939 | 1/1981 | Stromswold et al. | 375/1 |
| 4,384,357 | 5/1983 | de Buda et al. | 455/208 |
| 4,429,418 | 1/1984 | Hooper | 455/314 |
| 4,485,477 | 11/1984 | Nossen | 375/1 |
| 4,530,103 | 7/1985 | Mosley, Jr. et al. | 375/1 |
| 4,531,236 | 7/1985 | Ishihara | 455/330 |

Primary Examiner—Robert L. Griffin
Assistant Examiner—Stephen Chin
Attorney, Agent, or Firm—Thomas E. Schatzel

[57] ABSTRACT

A GPS satellite receiver is disclosed in which the frequency of the received satellite signal is down converted in a single step by a balanced mixer driven by a half-frequency local oscillator and the down-converted satellite signal is converted from analog-to-digital form by a hard limiter.

7 Claims, 1 Drawing Sheet

GLOBAL POSITIONING SYSTEM COURSE ACQUISITION CODE RECEIVER

BACKGROUND OF THE INVENTION

1. Field of the Invention

The present invention relates to radio receivers generally and more particularly to a GPS satellite receiver employing a balanced mixer and a half-frequency local oscillator for down converting the frequency of a received satellite signal in a single step and a hard limiter for converting from analog-to-digital form the down-converted satellite signal.

2. Description of the Prior Art

The NAVSTAR Global Positioning System (GPS) is a United States Defense Department satellite-based radio-navigation system transmitting information from which extremely accurate navigational information can be computed including the time, the user's three-dimensional position anywhere on or near the Earth, and the user's three-dimensional velocity. When fully operational, the GPS is planned to employ 18 satellites evenly dispersed in three, inclined, 12-hour circular orbits chosen to insure continuous 24-hour coverage worldwide. Each satellite carries extremely accurate cesium and rubidium vapor atomic clocks providing timing information. Additionally, each satellite is provided clock correction and orbital information by Earth-based monitoring stations.

Each satellite transmits a pair of L-band carrier signals including an L1 signal having a frequency of 1575.42 MHz (also referred to as 1540 f0 where f0 is 1.023 MHz) and an L2 signal having a frequency of 1227.6 MHz (1200 f0). The L1 and L2 signals are biphase modulated by pseudo-random noise (PRN) codes. The PRN codes facilitate multiple access. Since each satellite uses different PRN codes, a signal transmitted by a particular satellite can be selected by generating and matching (correlating) the corresponding PRN code pattern. Additionally, the PRN codes facilitate signal transit time measurements which can be made by measuring the phase shift required to match the code. Both of the carrier signals (L1 and L2) are modulated by a PRN code which is referred to as a precision (p) code. The p PRN code, which is intended for military purposes, is a relatively long, fine-grained, precision code having a clock rate of 10.23 MHz (10 f0). The L1 carrier signal is additionally modulated by a PRN code which is referred to as a clear/acquisition (C/A) code. The C/A PRN code, which is intended for rapid signal acquisition and for commercial purposes, is a relatively short, coarse-grained code having a clock rate of 1.023 MHz (f0) and a code length of 1023 bits (one ms). A full bit (chip) of C/A PRN code, phase delay corresponds to a distance of 293 meters. In addition to the PRN codes, both of the signals (L1 and L2) are, continuously, biphase modulated by a 50 bit per second, 1500 bit long, navigation data bit stream. The navigation data bit stream includes information as to the status and ephemeris of all satellites, parameters for computing the particular satellite clock, and corrections for atmospheric propagation delays.

Commonly, prior-art-type GPS receivers receive and down convert, in multiple steps, the frequency of an (L1 or L2) satellite signal. A typical prior-art-type GPS satellite receiver is disclosed in the paper by Phil Ward which is entitled "An Advanced NAVSTAR GPS Multiplex Receiver" and which was presented at the IEEE PLANS '80 1980 Position Location and Navigation Symposium, Atlantic City, N.J., Dec. 9, 1980. The above-identified receiver down converts the frequency of a satellite signal in two steps. For the first down-conversion step, the above-identified receiver employs an RF filter, a protective-type limiter, an RF amplifier and a first mixer all connected in cascade from an L-band antenna and a first-local-oscillator-signal-generating oscillator connected to also drive the mixer. In addition to attenuating off-frequency signals, the RF filter is operative to attenuate noise at the first-mixer-image frequency (the frequency other than the L1 or L2 frequency which differs from the frequency of the first-local-oscillator signal by the intermediate frequency). As indicated, the limiter is of the protective type to pass unaltered all signals except those of such unusually high level as present a danger of damaging the RF amplifier. The RF amplifier amplifies received signals so as to establish the receiver noise figure. The first-local-oscillator develops the first-local-oscillator signal to have a frequency which differs from the L1 or L2 frequency by the intermediate frequency to cause the first mixer to down convert to the intermediate frequency the frequency of the satellite signal.

For the second down-conversion step the above-identified receiver employs an IF filter, an IF amplifier, a second mixer, a filter, and a first AGC amplifier all connected in cascade from the first mixer output and a second local oscillator connected to also drive the mixer to develop at the AGC amplifier output the down-converted satellite signal.

Commonly, prior-art-type GPS satellite receivers use analog techniques to remove from the down-converted satellite signal dopler-shift information and PRN-code modulation. For removing the satellite-signal dopler-shift information, the above-identified receiver employs a frequency-controlled synthesizer for generating a signal representing the dopler-shift information and a mixer connected to multiply (a signal developed from) the down-converted satellite signal by (a signal developed from) the synthesized dopler-shift signal. For removing the PRN-code modulation, the above-identified receiver employs a phase-controlled synthesizer for generating a signal representing the pertinent PRN code and a mixer connected to multiply (a portion of) a signal developed by the dopler mixer by the synthesized PRN-code signal. Also employed is a bandpass filter and a second AGC amplifier connected in cascade from the PRN-code-mixer output.

Additionally, prior-art-type GPS satellite receivers commonly use a substantially analog, Costas-type loop for phase locking the receiver to the down-converted satellite signal. For this purpose, the above-identified receiver employs an oscillator for generating a pair of down-converted satellite-signal-frequency signals which are in phase quadrature and a pair of mixers connected to multiply the signal developed by the second AGC amplifier each by a respective one of the phase-quadrature signals to develop an in-phase (I) signal and a quadrature (Q) signal. The receiver also employs analog filters and amplifiers connected to filter and amplify the in-phase (I) and quadrature (Q) signals and a multiplexor, an analog-to-digital converter and an integrate-and-dump-type digital filter connected to convert to digital form the amplified and filtered in-phase (I) and quadrature (Q) signals. Further, the receiver employs a microcomputer connected to receive (signals developed from) the digitized in-phase (I) and quadrature (Q) signals and to control both the frequency of the dopler-shift-signal synthesizer and the phase of the PRN-code-signal synthesizer. From the relative velocity information (obtained from controlling the dopler-shift-signal synthesizer), the transit time information (obtained from controlling the phase of the PRN-code-signal synthesizer), and the navigation bit stream information (obtained from the in-phase (I) signal), the microcomputer computes navigational information.

Finally, the above-identified receiver employs tau-dither PRN-code-phase-matching-error minimizing circuitry which toggles the PRN-code-signal synthesizer one half bit early and one half bit late.

Another prior-art-type receiver is disclosed in an article by Roger McLean and Quyen D. Hua of Stanford Telecommunications, Inc., 1195 Bordeaux Drive, Sunnyvale, Calif. 94086, which is entitled "An Advanced Microprocessor-Controlled GPS Time Transfer System" which was presented at the 1983 National Aerospace Meeting of the Institute of Navigation, in Arlington, Va. on Mar. 22–25, 1983. This latter receiver employs circuitry which, in addition to generating a signal representing the punctual PRN code, generates a signal which represents the PRN code one half bit early and another signal which represents the PRN code one half bit late. An analog down-converted satellite signal is multiplied by a signal representing the difference between the early and late PRN-code signals in a tri-state mixer to develop a signal, which when filtered and amplified, is used by a microcomputer to minimize PRN-code-phase-matching error.

Although effective, it is no doubt apparent that the above-identified receivers are disadvantageous in that they are relatively complex, expensive and bulky.

In addition to the two above-identified articles, the reader may find of interest the article by Kai P. Yin, Ralph Eschenbach and Frank Lee which is entitled "Land Navigation With A Low Cost GPS Receiver" and which was reprinted from the National Telecommunication Conference, Nov. 30–Dec. 4, 1980, by the IEEE and an article by John W. Murphy and Michael D. Yakes of Collins Government Avionics Division, Cedar Rapids, Iowa 52498, which is entitled "Collins Avionics NAVSTAR GPS Advanced Digital Receiver" and which was presented at the Institute of Navigation's 1983 National Aerospace Meeting, Arlington, Va. on Mar. 22–25, 1983.

SUMMARY OF THE INVENTION

It is therefore an object of the present invention to provide a GPS satellite receiver which is relatively simple, inexpensive and compact.

Briefly, the presently preferred embodiment of a GPS satellite receiver in accordance with the present invention employs an L-band antenna for GPS signal reception, a bandpass filter for attenuating off-frequency signals, an amplifier for establishing the receiver noise figure and an image-reject mixer all connected in cascade and a half-frequency local-oscillator-signal-generating oscillator connected to also drive the mixer. The frequency of the local-oscillator signal is 768 f0, which, when doubled by the mixer, is used by the mixer to down-convert, in a single step, the frequency of an L1 (1540 f0) satellite signal to four f0.

The receiver also employs another amplifier, another bandpass filter and a hard limiter all connected in cascade from the mixer output. The hard limiter converts the (four f0) down-coverted satellite signal and associated noise from analog-to-digital form.

Additionally, the receiver employs a phase-controlled synthesizer for generating the pertinent PRN code in the form of a punctual, an early and a late signal and a frequency-controlled synthesizer for developing digital, phase-quadrature signals at the down-converted (dopler-shifted) carrier frequency (four f0). An exclusive-OR gate connected to develop a signal by comparing the signal developed by the hard limiter with the punctual PRN-code signal and a pair of counters connected to be clocked in quadrature by the dopler-shifted carrier-synthesizer-developed signals and to be incremented/decremented responsive to the state of the gate-developed signal are employed to remove the PRN-code-modulation information and to develop in phase (I) and quadrature (Q) Costas-loop signals. Circuitry represented by a pair of exclusive-OR gates connected to develop a pair of signals by comparing the hard-limiter-developed signal one with the early PRN-code signal and the other with the late PRN-code signal; an adder connected to develop a signal by summing the exclusive-OR-gate-pair-developed signals and a counter connected to be clocked by the in-phase one of the dopler-shifted carrier-synthesizer-developed signals and incremented/checked/decremented responsive to te state of the adder-developed signal is employed to develop a signal used to minimize PRN-code-phase-matching error. Finally, the receiver employs a microcomputer connected to receive the in-phase (I), the quadrature (Q) and the matching-error signals to control the phase of the PRN-code synthesizer and the frequency of the dopler-shifted-carrier synthesizer and to compute navigational information.

A material advantage of the present invention is the ability it affords to provide a GPS satellite receiver which is relatively simple, inexpensive and compact.

Another advantage of the present invention is the ability it affords to provide a GPS satellite receiver a substantial portion of which is amenable to integration in a gate-array-type device or in a custom LSI-type device.

These and other objects and advantages of the present invention will no doubt be apparent to those skilled in the art after having read the following detailed description of the invention which is illustrated in the figure of the drawing.

IN THE DRAWING

FIG. 1 is a block diagram illustrating the presently preferred embodiment of a GPS satellite receiver in accordance with the present invention.

DETAILED DESCRIPTION OF THE INVENTION

Figure 1:
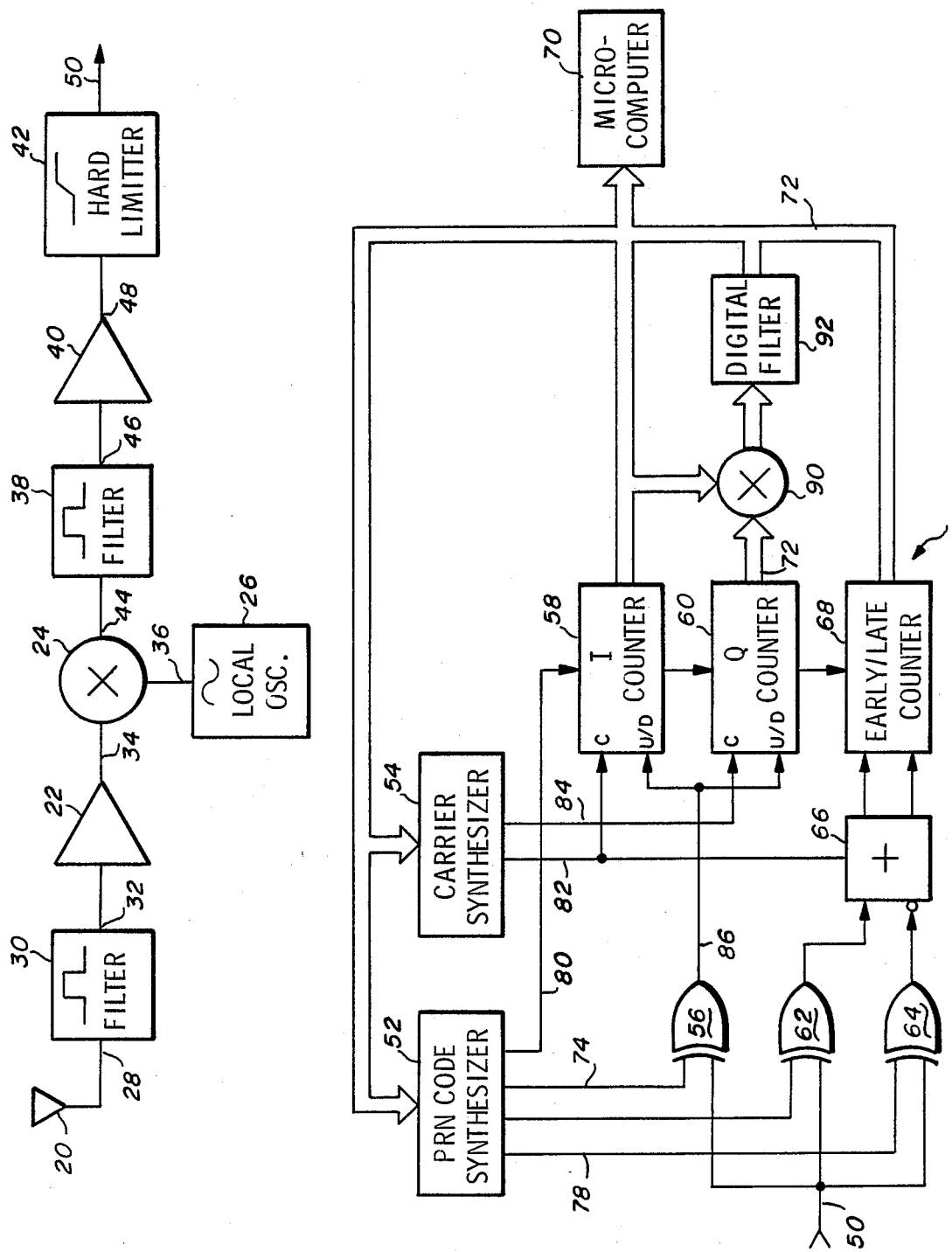

Illustrated in FIG. 1 of the drawing generally designated by the number 10 is the presently preferred embodiment of a GPS satellite receiver in accordance with the present invention. Receiver 10 is shown to employ an L-band antenna 20, an amplifier 22, an image-reject mixer 24, and a local oscillator 26. In the presently preferred embodiment, antenna 20 is of the quadrifilar-helix-type. For clarity, antenna 20 is shown connected by a line 28, a band-pass filter 30 and a line 32 to the input of amplifier 22. In the presently preferred embodiment, the filtering function is performed by an amplifier 22 which, preferably, is of the two-stage GaAs-FET type to provide a signal gain of 35 db and a three db bandwidth of 200 MHz at 1540 f0. Mixer 24, which is shown with the mixer RF input connected to the output of amplifier 22 by a line 34 and the mixer L0 input connected to the output of local oscillator 26 by a line 36, is of the starved-L0 balanced-type to cancel (reject) signals and noise at the mixer image frequency (1532 f0).

Oscillator 26 is operative to generate a 768 f0 signal the level of which is sufficient to cause mixer 24 to double the frequency of the signal to 1536 f0 for mixing with an L1 (1540 f0) satellite signal to down convert the frequency of the satellite signal directly to four f0. For this purpose, oscillator 26 includes a voltage-controlled oscillator connected to generate the mixer 24 driving, 768 f0, signal a device of the type which is designated CA3199E by RCA Incorporated and which is configured to divide by four the 768 f0 signal to develop a 192 f0 signal, a device of the type which is designated MC12009P by Motorola Inc. and which is configured to divide by five the 192 f0 signal to develop a 38.4 f0 signal, a CA3199E type device configured to divide by four the 192 f0 signal to develop a 48 f0 signal, and a device of the type which is designated MC10131P by Motorola Inc. and which is configured to divide by three the 48 f0 signal to develop a 16 f0 signal. Additionally, oscillator 26 includes an oven-regulated crystal-controlled oscillator for generating another 48 f0 signal, a device of the type which is designated MC12040P (phase comparator) by Motorola Inc. and which is configured to compare the phase of the two 48 f0 signals to develop an error signal, and the combination of an active filter and an amplifier connected in cascade between the comparator output and the voltage-controlled-oscillator input to complete a phase-locked loop for controlling (regulating) the frequency of the voltage-controlled-oscillator-generated signal.

Receiver 10 is also shown to employ another filter, designated 38, another amplifier, designated 40, and a hard limiter 42. Filter 38, which is shown connected to the output of mixer 24 by a line 44, and to the input of amplifier 40 by a cable 46, is of the six-pole, passive, band-pass-type having a center frequency of four f0 and a three db bandwidth of two MHz. Amplifier 40, which is configured around a device of the type which is commonly designated NE592, provides a gain of approximately 40 to 50 db, the gain being chosen to insure that hard limiter 42 provides hard limiting. Hard limiter 42, which is shown with the limiter input connected to the output of amplifier 42 by a cable 48 and the limiter output connected to a line 50, is employed to convert from analog-to-digital form the down-converted satellite signal and associated noise developed by amplifier 40 on line 48. For this purpose, hard limiter 42 includes a device of the type which is designated TBA120S (limiter) by Telefunken Ltd., a device of the type which is commonly designated 26LS32 (comparator), and a portion of a device of the type which is commonly designated 74S140N (four-input NAND gate configured as an inverter) all connected in cascade.

As previously indicated, hard limiter 42 is employed to convert from analog-to-digital form the signal developed by amplifier 40 on line 48, which includes both the down-converted satellite signal and the associated noise. It is important to note that because of the bandwidth, the level of the noise is substantially greater than the down-converted satellite-signal level. Thus, although the digital resolution of hard limiter 42 is but a single bit, no information is lost.

Additionally, receiver 10 is shown to employ a phase-controlled PRN-code-signal synthesizer 52, a frequency-controlled dopler-shifted carrier-signal synthesizer 54, three exclusive-OR gates, designated 56, 58 and 60, an adder 62, three counters, designated 64, 66 and 68, and a microcomputer 70. Synthesizer 52 is responsive to signals developed on a bus 72 by microcomputer 70 both for selecting a PRN-code and for controlling the phase of the code and operative to develop signals including on a line 74 a punctual PRN-code signal, on a line 76 a similar signal advanced (early) one-half bit (with respect to the punctual signal), on a line 78 a similar signal retarded (late) one-half bit (also with respect to the punctual signal), and on a line 80 a PRN-code-timing (epoch) signal. For this purpose, synthesizer 52 includes a device of the type which is commonly designated 2532 (read only memory) a device of the type commonly designated 74LS374 (octal-latch), a 74LS151 type device (one-of-eight data selector), three 74LS161 type devices (four-bit counter) a number of 74LS74, 74LS174 and 74LS175 type flip-flops and a number of gates. The read-only-memory device is used to store a number of 1023 bit PRN codes which are arranged in four groups of seven. A group of codes is selected by means of signals developed on two of the 12 addressing inputs of the read-only-memory device. When properly accessed, the selected group of seven codes are developed each on a respective one of seven of the eight data outputs of the read-only-memory device. On the eighth data output of the device is developed the timing signal. The octal-latch and one-of-eight-selector devices are used for code selection. The octal-latch device is connected to selectively latch the state of signals developed by microcomputer 70 on bus 72. Two of the latched signals are used to drive the respective two signal inputs of the read-only-memory device for code-group selection. Another three of the latched signals are used to drive the three data-selecting-signal inputs of the one-of-eight data-selector device which is connected to couple to the device output the PRN code developed at the selected one of seven of the eight data outputs of the read-only-memory device. The three four-bit-counter devices are used for accessing the read-only-memory device. The four-bit-counter devices are connected in cascade and configured to develop ten (binary-bit) signals each for driving a respective one of the ten respective read-only-memory-device-addressing-signal inputs. The signals represent a repeating series of 1023 sequential addresses each for accessing a bit of the PRN code. The flip-flops are configured to latch each bit of the PRN code to provide the one-half bit delays for the early, the punctual and the late signals and to provide a 1/16th bit fine-phase control.

Synthesizer 54 is responsive to signals developed on bus 72 by microcomputer 70 for controlling, to within one-quarter Hz resolution, the synthesizer frequency and operative to generate a pair of digital signals in phase quadrature, each on a corresponding one of a pair of lines, designated 82 and 84. For this purpose, synthesizer 54 includes six devices of the type commonly designated 74LS288 (four-bit adder), three 74LS273 type devices (octal flip-flop), four 74 LS374 type devices (octal-latch), a 74LS138 type device (decoder), a number of 74LS175 type flip-flops and a number of gates. The six four-bit-adder devices are connected, with a flop-flop, in cascade to form a 24-bit adder. The three octal-flip-flop devices are connected to latch the state of the signal developed at each of the adder (sum) outputs and to drive the adder B inputs each with a corresponding one of the latched signals. One of the octal-latch devices, the decoder device, and three of the flip-flops are configured to selectively latch the state of signals developed by microcomputer 70 on bus 72 and to selectively load the latched signals into the other three octal-latch devices. The latter three octal-latch devices are connected to drive the adder A inputs each with a respective bit of the latched signals.

For clarity, a single exclusive-OR gate, gate 56, is shown connected to compare the state of the signal developed by hard limiter 42 on line 50 with the state of the punctual PRN-code signal developed by synthesizer 52 on line 74 to develop on a line 86 a signal for driving both counters 58 and 60. In the presently preferred embodiment, two exclusive-OR gates are used, one for driving counter 58 and the other for driving counter 60. Further, the signals for driving the former gate are each latched in a flip-flop for proper timing.

Counters 58, 60 and 68 each include three 74LS193 type devices (four-bit up/down counter) which are connected in cascade to form a 12-bit counter. Additionally, counter 58 includes one, and counters 60 and 68 each include one and one-half 74LS374 type devices (octal-latch) connected to latch the state of the signals representing the count developed by the respective 12-bit counter and to selectively couple the latched signals onto bus 72. Counters 58 and 60 also include a number of 74LS175 type flip-flops and a number of gates configured to develop a count-up signal and a count-down signal suitable for driving each of the 12-bit counters from the (count up/down) signal developed on line 86 and the (clocking) signals developed on lines 82 and 84. In the presently preferred embodiment, counter 68 also includes a number of 74LS174 type flip-flops and a number of gates configured to perform functions which, for clarity, are represented by exclusive-OR gates 62 and 64 and adder 66. Specifically, the flip-flops and gates increment the respective 12-bit counter when the state of a given one, and only one, of the early and late PRN-code signals developed on lines 76 and 78 is the same as (correlates with) the state of the signal developed by hard limiter 42 on line 50, decrement the counter when only the other one correlates, and not count (check) when both correlate or neither correlates.

Microcomputer 70, which is configured around a device of the type which is designated 6809 by Motorola Inc., and related supporting devices, is connected to bus 72 both to receive the signals developed by counters 58, 60 and 68 and to develop signals for controlling synthesizers 52 and 54. To receive the L1 signal transmitted by a particular satellite, microcomputer 70 is operative to cause PRN-code synthesizer 52 to develop the associated PRN code. Also, microcomputer 70 is responsive to the signals developed by (early/late) counter 68 and operative to control the phase of the synthesizer 52 developed PRN-code signals so as to phase-lock the phase of the punctual PRN-code signal developed on line 74 to the phase of the corresponding down-converted satellite signal. Additionally, microcomputer 70 is responsive to the signals developed by (Q) counter 60 and operative to control the frequency of the synthesizer 54 developed dopler-shifted-carrier signals so as to phase-lock the frequency of the synthesized signals to the frequency of the down-converted satellite signal. Further, microcomputer 70 is responsive to the transit time information obtained from controlling synthesizer 52, the relative velocity information obtained from controlling synthesizer 54 and the navigational data bit stream information obtained from (I) counter 58 and operative to computer navigational information.

Microcomputer 70 compensates for the (navigational data bit stream) biphase modulation on the down-converted satellite signal to phase-lock synthesizer 54. Specifically, microcomputer 70 is responsive to the binary state of the signal representing the sign bit of the (count) signals developed by (I) counter 58 and operative to invert/or not, the sign bit signal of the (Q) counter 60 developed signals. For clarity, the sign-bit-inverting and subsequent digital-filtering steps performed by microcomputer 70 are represented by separate blocks including a mixer 90 and a second-order discrete-time-sample filter 92.

Further, microcomputer 70 compensates for variations in the down-converted satellite-signal level to maintain the synthesizer 54 phase-locked-loop-gain constant. Microcomputer 70 is responsive to the (I) counter 58 signals and operative to adjust the filter 92 gain parameters. (It is important to note that rather than reflecting the signal level, the (I) counter 58 developed signals reflect the signal to noise ratio. However, the noise level is relatively constant.)

A substantial portion of the digital portion of receiver 10 is integrated in a gate-array-type device in another embodiment and in a custom LSI-type device in still another embodiment.

It is contemplated that after having read the preceding disclosure certain alterations and modifications of the present invention will no doubt become apparent to those skilled in the art. It is therefore intended that the following claims be interpreted to include all such alterations and modifications as fall within the true spirit and scope of the invention.

I claim:

1. A GPS satellite receiver for locking to a satellite signal, the receiver comprising in combination:
   means for receiving the satellite signal;
   first coupling means;
   down-converting means connected to said receiving means by said first coupling means, said down-converting means for down converting to a first frequency the frequency of a signal developed from said received satellite signal;
   second coupling means;
   a hard limiter connected to said down-converting means by said second coupling means, said hard limiter for converting from analog-to-digital form a signal developed from said down-converted satellite signal;
   third coupling means;
   carrier-synthesizer means for generating a first signal having a frequency established by carrier-synthesizer-means-driving signals;
   Q-counter means connected to said hard limiter by said third coupling means and connected to said carrier-synthesizer means, said Q-counter means for developing signals representing a count which is incremented at each of a series of times marked by said first carrier-synthesizer-means-generated signal when a signal developed from a signal developed by said hard limiter has a predetermined one of two states and decremented at each of said first carrier-synthesizer-means-generated-signal marked times otherwise; and controller means connected to said carrier-synthesizer means and connected to said Q-counter means, said controller means being responsive to said Q-counter-means-developed signals and operative to develop said carrier-synthesizer-means-driving signals so as to lock the frequency of said first carrier-synthesizer-means-generated signal to said down-converter-means first frequency.

2. A receiver as recited in claim 1 wherein said down-converting means includes local-oscillator means for generating a signal having a frequency one-half the frequency of a predetermined one of the two frequencies which differ from the frequency of said received-satellite signal by said first down-converter-means frequency and a balanced mixer connected to said local-oscillator means, connected to said receiving means by said first coupling means and connected to said hard limiter by said second coupling means, said balanced mixer for developing a signal by doubling the frequency of said local-oscillator-means-generated signal and for mixing said doubled-frequency signal with said signal developed from said received satellite signal to develop said down-converted satellite signal.

3. A receiver as recited in claim 2 wherein said first coupling means includes means for filtering and amplifying said received satellite signal to develop said down-converting-means-driving signal.

4. A receiver as recited in claim 2 wherein said second coupling means includes means for filtering and amplifying said down-converted satellite signal to develop said hard-limiter-driving signal.

5. A receiver as recited in claim 2 wherein said carrier-synthesizer means further generates a second signal which is in phase quadrature with said first carrier-synthesizer-means-generated-signal and wherein the receiver further comprises I-counter means connected to said hard limiter by said third coupling means, connected to said carrier-synthesizer means and connected to said controller means, said I-counter means for developing controller-means-driving signals representing a count which is incremented at each of a series of times marked by said second carrier-synthesizer-means-generated signal when said signal developed from said signal developed by said hard limiter has a predetermined one of two states and decremented at each of said second carrier-synthesizer-means-generated-signal marked times otherwise.

6. A receiver as recited in claim 2 wherein said satellite signal is biphase modulated by a PRN code, wherein said third coupling means includes PRN-code-synthesizer means for generating an early, a punctual and a late signal each representing said PRN code and each having a phase established by PRN-code-synthesizer-means-driving signals and exclusive-OR-gate means connected to said PRN-code-synthesizer means, connected to said hard limiter and connected to said Q-counter means, said exclusive-OR-gate means for comparing the state of said hard-limiter-developed signal with the state of said punctual-PRN-code-synthesizer-means-generated signal to develop said Q-counter-means-driving signal, wherein the receiver further comprises early/late means connected to said PRN-code synthesizer, connected to said hard limiter and connected to said controller means, said early/late means for comparing the state of said hard-limiter-developed signal with the state of said early and said late-PRN-code-synthesizer-means-developed signals to develop controller-means-driving signals representing the difference between an early and a late count, and wherein said controller means is further responsive to said early/late-means-developed signals and operative to develop said PRN-code-synthesizer-means-driving signals so as to lock the phase of said PRN-code-synthesizer-developed signals to said satellite signal PRN-code phase.

7. A GPS satellite receiver for locking to a satellite signal, the receiver comprising in combination:
means for receiving the satellite signal;
first coupling means;
down-converting means connected to said receiving means by said first coupling means, said down-converting means for down converting to a first frequency the frequency of a signal developed from said received satellite signal;
second coupling means;
carrier-synthesizer means for generating a first signal having a frequency established by carrier-synthesizer-means-driving signals;
Q-counter means connected to said down-converting means by said second coupling means and connected to said carrier-synthesizer means, said Q-counter means for developing signals representing a count which is incremented at each of a series of times marked by said first carrier-synthesizer-means-generated signal when a signal developed from said down-converted satellite signal has a predetermined one of two states and decremented at each of said first carrier-synthesizer-means-generated-signal marked times otherwise; and
controller means connected to said carrier-synthesizer means and connected to said Q-counter means, said controller means being responsive to said Q-counter-means-developed signals and operative to develop said carrier-synthesizer-means-driving signals so as to lock the frequency of said first carrier-synthesizer-means-generated signal to said first down-converter-means frequency.

* * * * *